(12) United States Patent
Ayyapureddi

(10) Patent No.: US 12,204,770 B2
(45) Date of Patent: Jan. 21, 2025

(54) APPARATUSES, SYSTEMS, AND METHODS FOR MANAGING METADATA SECURITY AND ACCESS

(71) Applicant: MICRON TECHNOLOGY, INC., Boise, ID (US)

(72) Inventor: Sujeet Ayyapureddi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/730,992

(22) Filed: Apr. 27, 2022

(65) Prior Publication Data
US 2023/0350581 A1 Nov. 2, 2023

(51) Int. Cl.
*G11C 8/00* (2006.01)
*G06F 3/06* (2006.01)
*G06F 13/16* (2006.01)

(52) U.S. Cl.
CPC .......... *G06F 3/0622* (2013.01); *G06F 3/0655* (2013.01); *G06F 3/0679* (2013.01); *G06F 13/1668* (2013.01)

(58) Field of Classification Search
CPC .... G11C 8/10; G11C 8/08; G11C 8/12; G11C 8/14; G06F 11/4085
USPC ........................................ 365/230.06, 189.12
See application file for complete search history.

(56) References Cited

U.S. PATENT DOCUMENTS

| | | | |
|---|---|---|---|
| 9,158,617 B2 | 10/2015 | Cho et al. | |
| 10,127,101 B2 | 11/2018 | Halbert et al. | |
| 10,243,590 B1 | 3/2019 | Seshadri | |
| 10,817,371 B2 | 10/2020 | Rooney et al. | |
| 11,074,126 B2 | 7/2021 | Prather et al. | |
| 11,200,961 B1 | 12/2021 | Uribe | |
| 11,579,971 B2 | 2/2023 | Ayyapureddi | |
| 11,615,861 B2 | 3/2023 | Kim et al. | |
| 2006/0233030 A1 | 10/2006 | Choi | |
| 2008/0089129 A1 | 4/2008 | Lee | |
| 2008/0313493 A1 | 12/2008 | Roohparvar et al. | |
| 2009/0132876 A1 | 5/2009 | Freking et al. | |
| 2009/0168523 A1 | 7/2009 | Shirakawa et al. | |

(Continued)

OTHER PUBLICATIONS

U.S. Appl. No. 17/730,381, titled "Apparatuses, Systems, and Methods for Per Row Error Scrub Information", filed Apr. 27, 2022; pp. all pages of application as filed.

(Continued)

*Primary Examiner* — Son T Dinh
(74) *Attorney, Agent, or Firm* — Dorsey & Whitney LLP

(57) ABSTRACT

Apparatuses, systems, and methods for managing access to metadata stored at a memory. To manage access to metadata, a mode register is configured to receive a metadata enable setting and to provide a metadata enable signal based on the metadata enable setting. A metadata access control circuit configured to receive a column address identifying a particular column to be accessed within a memory array. The metadata access control circuit blocks access to a column corresponding to the column address when the column address matches one of a plurality of particular column addresses designated for storage of metadata and the metadata enable signal has a first value, and permits access to a column corresponding to the column address when the column address is different than every one of the a plurality of particular column addresses designated for storage of metadata or the metadata enable signal has a second value.

21 Claims, 3 Drawing Sheets

(56) References Cited

U.S. PATENT DOCUMENTS

| | | |
|---|---|---|
| 2009/0196103 A1 | 8/2009 | Kim et al. |
| 2010/0177582 A1 | 7/2010 | Kim et al. |
| 2010/0177587 A1 | 7/2010 | Huang |
| 2011/0154158 A1 | 6/2011 | Yurzola et al. |
| 2013/0117630 A1 | 5/2013 | Kang |
| 2015/0193464 A1* | 7/2015 | Kwon ............... G06F 16/1815 707/648 |
| 2016/0092307 A1 | 3/2016 | Bonen et al. |
| 2017/0060681 A1 | 3/2017 | Halbert et al. |
| 2017/0091025 A1 | 3/2017 | Ahn et al. |
| 2017/0249097 A1 | 8/2017 | Eguchi |
| 2017/0269992 A1 | 9/2017 | Bandic et al. |
| 2017/0285990 A1 | 10/2017 | Chen et al. |
| 2017/0344423 A1 | 11/2017 | Hsiao et al. |
| 2018/0121283 A1 | 5/2018 | Plants |
| 2019/0103154 A1 | 4/2019 | Cox et al. |
| 2020/0019462 A1 | 1/2020 | Prather et al. |
| 2020/0104205 A1 | 4/2020 | Noguchi et al. |
| 2020/0104208 A1 | 4/2020 | Heo et al. |
| 2020/0226039 A1 | 7/2020 | Lee |
| 2020/0373941 A1 | 11/2020 | Latorre et al. |
| 2021/0064282 A1 | 3/2021 | He et al. |
| 2021/0083687 A1 | 3/2021 | Lee et al. |
| 2021/0142860 A1 | 5/2021 | Song et al. |
| 2021/0208967 A1 | 7/2021 | Cha et al. |
| 2021/0224155 A1 | 7/2021 | Bains et al. |
| 2021/0247910 A1 | 8/2021 | Kim et al. |
| 2021/0311830 A1* | 10/2021 | Lee ..................... G11C 29/52 |
| 2021/0358559 A1 | 11/2021 | Suh et al. |
| 2022/0084565 A1 | 3/2022 | Prather et al. |
| 2022/0091938 A1 | 3/2022 | Buerkle et al. |
| 2022/0197739 A1 | 6/2022 | Ryu et al. |
| 2022/0334917 A1 | 10/2022 | Veches |
| 2022/0337271 A1 | 10/2022 | Hanna |
| 2022/0415398 A1 | 12/2022 | Lien et al. |
| 2023/0146549 A1 | 5/2023 | Lien et al. |
| 2023/0161665 A1 | 5/2023 | Choi et al. |
| 2023/0185665 A1 | 6/2023 | Ayyapureddi |
| 2023/0350748 A1 | 11/2023 | Ayyapureddi |
| 2023/0352064 A1 | 11/2023 | Ayyapureddi |
| 2023/0352112 A1 | 11/2023 | Ayyapureddi |

OTHER PUBLICATIONS

U.S. Appl. No. 17/731,024, titled "Apparatuses, Systems, and Methods for Managing Metadata Storage At a Memory", filed Apr. 27, 2022; pp. all pages of the application as filed.
U.S. Appl. No. 17/730,396, titled "Apparatuses, Systems, and Methods for Per Row Error Scrub Information Registers", filed Apr. 27, 2022; pp. all pages of application as filed.
U.S. Appl. No. 18/441,775 titled "Apparatuses and Methods for Settings for Adjustable Write Timing" filed Feb. 14, 2024, pp. all pages of the application as filed.
U.S. Appl. No. 18/441,830 titled "Apparatuses, Systems, and Methods for Storing and Accessing Memory Metadata and Error Correction Code Data" filed Feb. 14, 2024, pp. all pages of the application as filed.
PCT Application No. PCT/US23/76430 titled "Apparatuses and Methods for Separate Write Enable for Single-Pass Access of Data, Metadata, and Parity Information" filed Oct. 10, 2023, pp. all pages of application as filed.
PCT Application No. PCT/US23/76433 titled "Apparatuses and Methods for Single-Pass Access of ECC Information, Metadata Information or Combinations Thereof" filed Oct. 10, 2023; pp. all pages of application as filed.
PCT Application No. PCT/US24/13516, titled "Apparatuses, Systems, and Methods for Storing Memory Metadata" filed Jan. 30, 2024; pp. all pages of application as filed.
U.S. Appl. No. 18/424,282 titled "Apparatuses and Methods for Bounded Fault Compliant Metadata Storage" filed Jan. 26, 2024; pp. all pages of application as filed.
U.S. Appl. No. 18/424,342 titled "Apparatuses and Methods for Bounded Fault Compliant Metadata Storage" filed Jan. 26, 2024; pp. all pages of application as filed.
U.S. Appl. No. 18/430,381, titled "Apparatuses, Systems, and Methods for Storing Memory Metadata", filed Feb. 1, 2024; pp. all pages of application as filed.
U.S. Appl. No. 18/430,406, titled "Apparatuses, Systems, and Methods for Storing Memory Metadata", filed Feb. 1, 2024; pp. all pages of application as filed.
U.S. Appl. No. 18/431,232, titled "Apparatuses, Systems, and Methods for Storing Memory Metadata", filed Feb. 2, 2024; pp. all pages of application as filed.
U.S. Appl. No. 18/431,306, titled "Apparatuses, Systems, and Methods for Storing Memory Metadata", filed Feb. 2, 2024; pp. all pages of application as filed.
U.S. Appl. No. 18/504,215 titled "Apparatuses and Methods for Enhanced Metadata Support" filed Nov. 8, 2023; pp. all pages of application as filed.
U.S. Appl. No. 18/504,234 titled "Apparatuses and Methods for Enhanced Metadata Support" filed Nov. 8, 2023; pp. all pages of application as filed.
U.S. Appl. No. 18/504,302 titled "Apparatuses and Methods for Configurable ECC Modes" filed Nov. 8, 2023; pp. all pages of application as filed.
U.S. Appl. No. 18/504,316 titled "Apparatuses and Methods for Configurable ECC Modes" filed Nov. 8, 2023; all pages of application as filed.
U.S. Appl. No. 18/504,324 titled "Apparatuses And Methods For Single-Pass Access Of ECC Information, Metadata Information Or Combinations Thereof" filed Nov. 8, 2023, all pages of application as filed.
U.S. Appl. No. 18/504,342 titled "Apparatuses and Methods for Single-Pass Access of ECC Information, Metadata Information or Combinations Thereof" filed Nov. 8, 2023; pp. all pages of application as filed.
U.S. Appl. No. 18/504,353 titled "Apparatuses and Methods for Separate Write Enable for Single-Pass Accessof Data, Metadata, and Parity Information" filed Nov. 8, 2023; pp. all pages of application as filed.
U.S. Appl. No. 18/504,362 titled "Apparatuses and Methods for Separate Write Enable for Single-Pass Access of Data, Metadata, and Parity Information" filed Nov. 8, 2023; pp. all pages of application as filed.
U.S. Appl. No. 18/625,539, titled "Apparatuses, Systems, and Methods for Per Row Error Scrub Information" filed Apr. 3, 2024, pp. all pages of application as filed.
PCT Application No. PCT/US24/39192 titled "Apparatuses and Methods for Scalable 1-Pass Error Correction Code Operations" filed Jul. 23, 2024, pp. all pages of the application as filed.
PCT Application No. PCT/US24/39195 titled "Apparatuses and Methods for Half-Page Modes of Memory Devices" filed Jul. 23, 2024, pp. all pages of the application as filed.
PCT Application No. PCT/US24/39231 titled "Apparatuses and Methods for Granular Single-Pass Metadata Access Operations" filed Jul. 24, 2024, pp. all pages of the application as filed.
U.S. Appl. No. 18/743,994 titled "Apparatuses and Methods for Shared Codeword in 2-Pass Access Operations" filed Jun. 14, 2024, pp. all pages of the application as filed.
U.S. Appl. No. 18/745,577 titled "Apparatuses and Methods for Half-Page Modes of Memory Devices" filed Jun. 17, 2024, pp. all pages of the application as filed.
U.S. Appl. No. 18/745,843 titled "Apparatuses and Methods for Half-Page Modes of Memory Devices" filed Jun. 17, 2024, pp. all pages of the application as filed.
U.S. Appl. No. 18/745,877 titled "Apparatuses and Methods for Half-Page Modes of Memory Devices" filed Jun. 17, 2024, pp. all pages of the application as filed.
U.S. Appl. No. 18/745,894 titled "Apparatuses and Methods for Half-Page Modes of Memory Devices" filed Jun. 17, 2024, pp. all pages of the application as filed.

(56) References Cited

OTHER PUBLICATIONS

U.S. Appl. No. 18/747,658, titled "Apparatuses and Methods for Bounded Fault Compliant Metadata Storage" filed Jun. 19, 2024, pp. all pages of application as filed.
U.S. Appl. No. 18/747,676, titled "Apparatuses and Methods for Alternate Memory Die Metadata Storage", filed Jun. 19, 2024, pp. all pages of application as filed.
U.S. Appl. No. 18/747,696, titled "Apparatuses and Methods for Scalable 1-Pass Error Correction Code Operations", filed Jun. 19, 2024, pp. all pages of application as filed.
U.S. Appl. No. 18/747,712, titled "Apparatuses and Methods for Granular Single-Pass Metadata Access Operations" filed Jun. 19, 2024, pp. all pages of application as filed.
U.S. Appl. No. 18/747,635, titled "Apparatuses and Methods for Read/Modify/Write Single-Pass Metadata Access Operations" filed Jun. 19, 2024, pp. all pages of application as filed.

* cited by examiner

APPARATUSES, SYSTEMS, AND METHODS FOR MANAGING METADATA SECURITY AND ACCESS

BACKGROUND

This disclosure relates generally to semiconductor devices, such as semiconductor memory devices. The semiconductor memory device may include a memory array configured to store data. In some applications, metadata may be provided in addition to the data. Metadata can provide contextual or bibliographic-type information about the underlying data. The metadata may be used in the processing of the data, in some examples. Metadata can include important and/or sensitive information that could be necessary to process and/or used to exploit the underlying data. As such, it is imperative that metadata is secure and unauthorized access is protected.

DETAILED DESCRIPTION

Figure 1:
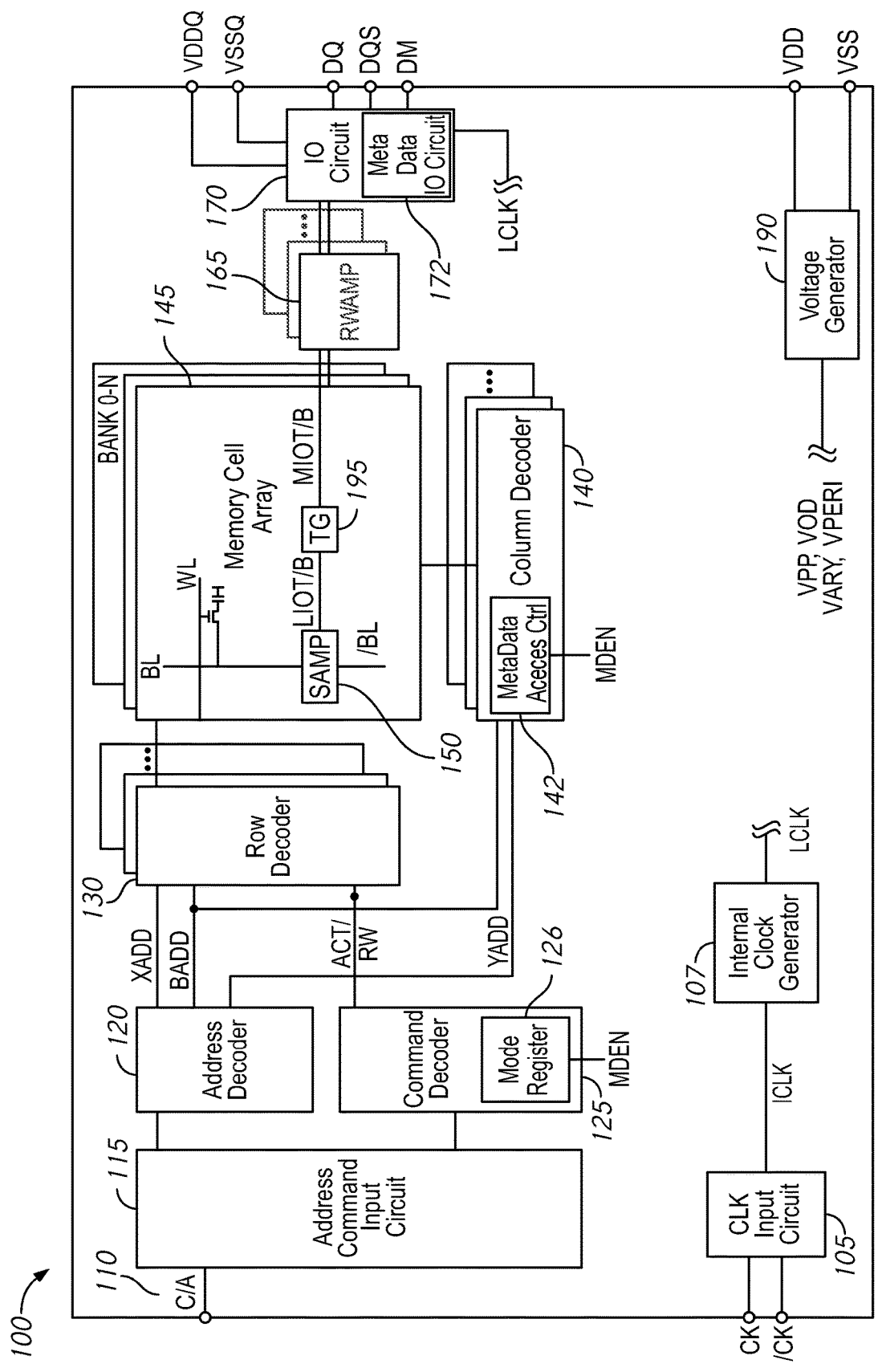
FIG. 1 is a block diagram of a semiconductor device according some embodiments of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

This disclosure describes examples of a memory device configured with a metadata storage feature that allows storage of metadata along with underlying data at a memory array. The memory may internally determine where to store the metadata, in some examples. Accordingly, when a controller issues an access command, the corresponding address provided by the controller may intentionally or unwittingly include columns of memory that are set aside for metadata storage. In order to protect the metadata from being accessed accidentally or intentionally by the controller, a mode register setting may be employed to control access to the metadata. That is, the mode register setting, and metadata access circuitry may be configured to prevent that data from being overwritten and/or prevent unauthorized access of the metadata. In some examples, the mode register setting may default to blocking columns set aside for metadata storage, and is only disabled via an affirmative mode register setting change. In some examples, the mode register setting to block metadata access may be supported by a designated fuse (e.g., access is blocked unless a designated fuse us blown). In some examples, a column decoder may include metadata access circuitry that is configured to detect a match between a column address and a designated metadata column address, and prevent the column from firing when the match is detected.

A memory array may be divided into a number of column planes each having a common number of columns. When data is stored at the memory array, it is split up such that a respective subset of the data is stored at a respective column of each column plane. During an access operation, only one column in a column plane can be accessed contemporaneously, so splitting up the data across multiple column planes allows all of the data to be stored in parallel. The same column address is used to identify the column within each column plane at which the data will be or is stored. For example, during a write operation, a particular column address may designate that column X is to be activated in each column plane to store data.

However, to preserve space for metadata, a subset of columns may be set aside to in each column plane to store the metadata. Because metadata (e.g., 8 or 16 bits) is a far smaller data set than the underlying data (e.g., 64, 128, etc. bits), not all column planes are needed to store metadata for a particular data set. For example, an array may include 16 column planes, each having 64 columns. Each column within a particular column plane may be capable of storing eight bits of data during one access operation. So, if column X is activated in each of 16 column planes, a total of 128 bits could be read or written in parallel. However, because corresponding metadata is a smaller number of bits (e.g., 8 or 16 bits), not all column planes would be necessary to store the metadata.

An internal metadata address generator may be configured to determine a column address and a column plane address designating a location where metadata associated with data stored at a particular address is located. For example, during a write operation, an address and corresponding write data may be received at the memory device. The write data may be stored at the received address. However, in addition to the write data, metadata corresponding to the write data may also be received at the memory device. The metadata may be additional data that has to be stored at a separate location from the write data. The internal metadata address generator may be configured to map a metadata address to the address associated with the write data. The metadata may be stored at the metadata address mapped to the address storing the write data. In a similar manner, during a read operation, a read address may be received. The internal metadata address generator may be configured to map the read address to a metadata address, which may include metadata corresponding to the read data stored at the read address. In some examples, the semiconductor device may perform a double-cycle access operations to store and retrieve both the underlying data, as well as the corresponding metadata.

To determine which column plane is used to store the metadata, the internal metadata address generator may be configured to use the column address. In addition, because there are fewer column planes than columns within each plane, the address generator may be configured to use a subset of the column address bits to assign a particular column plane for storage of metadata corresponding to the column address. Thus, to map received read or write column addresses to corresponding metadata addresses, the internal metadata address generator may process a subset of bits of the column address to derive a column plane mapped to the metadata. For example, the internal metadata address generator may decode a subset of least-significant bits of the column address to determine a unique column plane at which the metadata is stored. In some examples, the bits of the column address the internal metadata address generator may use to map to a column plane may be based on a number of bits of metadata and the system architecture (e.g., ×4, ×8, ×16, etc.). Using a subset of the column address bits to map storage of metadata within the array may be more efficient in terms of hardware complexity and time consumption as compared with using the entire column address.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 145. The memory array 145 is shown as including a plurality of memory banks. In the embodiment of FIG. 1, the memory array 145 is shown as including eight memory banks BANK0-BANK7. More or fewer banks may be included in the memory array 145 of other embodiments. Each memory bank includes a plurality of word lines WL, a plurality of bit lines BL, and a plurality of memory cells MC arranged at intersections of the plurality of word lines WL and the plurality of bit line BL. The selection of the word line WL is performed by a row decoder 130 and the selection of the bit lines BL is performed by a column decoder 140. In the embodiment of FIG. 1, the row decoder 130 includes a respective row decoder for each memory bank and the column decoder 140 includes a respective column decoder for each memory bank. The bit lines BL are coupled to a respective sense amplifier (SAMP) 150. Read data from the bit line BL is amplified by the sense amplifier SAMP, and transferred to read/write amplifiers and an error correction code (ECC) control circuit (RWAMP and ECC control circuit) 165 over complementary local data lines (LIOT/B), transfer gate (TG), and complementary main data lines (MIOT/B). Conversely, write data outputted from the RWAMP and ECC 120 is transferred to the sense amplifier SAMP 150 over the complementary main data lines MIOT/B, the transfer gate TG 195, and the complementary local data lines LIOT/B, and written in the memory cell MC coupled to the bit line BL.

The semiconductor device 100 may employ a plurality of external terminals that include command and address (C/A) terminals 110 coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to a clock input circuit 105. The external clocks may be complementary. The clock input circuit 105 generates an internal clock ICLK based on the CK and /CK clocks. The ICLK clock is provided to the command decoder 140 and to an internal clock generator 107. The internal clock generator 107 provides various internal clocks LCLK based on the ICLK clock. The LCLK clocks may be used for timing operation of various internal circuits. The internal data clocks LCLK are provided to the input/output circuit 170 to time operation of circuits included in the input/output circuit 170, for example, to data receivers to time the receipt of write data.

The C/A terminals may be supplied with memory addresses. The memory addresses supplied to the C/A terminals are transferred, via an address/command input circuit 115, to an address decoder 120. The address decoder 120 receives the address and supplies a decoded row address XADD to the row decoder 130 and supplies a decoded column address YADD to the column decoder 140. The address decoder 120 may also supply a decoded bank address BADD, which may indicate the bank of the memory array 145 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 140 via the address/command input circuit 115. The command decoder 140 includes circuits to decode the internal command signals to generate various internal signals and commands for performing operations. For example, the command decoder 140 may provide a row command signal to select a word line and a column command signal to select a bit line.

The device 100 may receive access commands. When the access command is a read command, and a bank address, a row address and a column address are timely supplied with the read command, a codeword including read data and read parity bits is read from memory cells in the memory array 145 corresponding to the row address and column address. The read command is received by the command decoder 140, which provides internal commands so that read data from the memory array 145 is provided to the RWAMP and ECC control circuit 120. The RWAMP and ECC control circuit 120 may use the parity bits in the codeword to determine if the codeword includes any errors, and if any errors are detected, may correct them to generate a corrected codeword (e.g., by changing a state of the identified bit(s) which are in error). The corrected codeword (without the parity bits) is output to outside the device 100 from the data terminals DQ via the input/output circuit 170.

The device 100 may receive an access command which is a write command. When the write command is received, and a bank address, a row address, and a column address are timely supplied as part of the write operation, and write data is supplied through the DQ terminals to the RWAMP and ECC control circuit 120. The write data supplied to the data terminals DQ is written to a memory cells in the memory array 145 corresponding to the row address and column address. The write command is received by the command decoder 140, which provides internal commands so that the write data is received by data receivers in the input/output circuit 170. Write clocks may also be provided to the external clock terminals for timing the receipt of the write data by the data receivers of the input/output circuit 170. The write data is supplied via the input/output circuit 170 to the RWAMP and ECC control circuit 120. The RWAMP and ECC control circuit 120 may generate a number of parity bits based on the write data, and the write data and the parity bits may be provided as a codeword to the memory array 145 to be written into the memory cells MC.

In some examples, the semiconductor device 100 may be configured to support a metadata feature that facilitates handling of metadata corresponding to particular data. Typically, to manage data storage, the memory array 145 may be divided into a number of column planes each having a common number of columns. When the underlying data is stored at the memory array 145, it is split up such that a respective subset of the data is stored at a respective column of each column plane. During an access operation, only one column in a column plane can be accessed contemporaneously, so splitting up the data across multiple column planes allows all of the underlying data to be stored in parallel. The same column address is used to identify the column within each column plane at which the data will be or is stored. For example, during a write operation, a particular column address may designate that column X is to be activated in each column plane to store write data.

However, to preserve space for metadata, the semiconductor device 100 may internally set aside a subset of columns within each column plane may be set aside to store the metadata. Because metadata (e.g., 8 or 16 bits) is a smaller data set than the underlying data (e.g., 64, 128, etc., bits), not all column planes are needed to store metadata for a particular data set. For example, the memory array 145 may include 16 column planes, each having 64 columns. Each column within a particular column plane may be capable of storing eight bits of data during one access operation. So, if column X is activated in each of 16 column planes, a total of 128 bits could be read or written in parallel. However, because corresponding metadata is a smaller number of bits (e.g., 8 or 16 bits), not all column planes would be necessary to store the metadata.

Because the metadata columns are determined internally, the controller communicating with the semiconductor device 100 may be unaware of which columns are configured to metadata storage. Thus, a mode register 126 of the command decoder 125, a metadata access control circuit 142 of the column decoders 140, and a metadata input/output circuit 172 of the input/output circuit 170 may be configured to manage metadata storage, including preventing the metadata form being overwritten or otherwise accessed when the metadata feature is enabled. The metadata feature may be enabled via a mode register setting stored at the mode register 126. The mode register 126 may be configured to provide a metadata enable signal MDEN to indicate whether the metadata feature is enabled. In some examples, the mode register setting of the mode register 126 that enables the metadata feature may default to an enabled state. When a controller issues an access command, the corresponding address provided by the controller may intentionally or unwittingly include corresponding to columns of the memory array 145 that are set aside for metadata storage.

In order to protect the metadata from being accessed accidentally or intentionally by the controller, the mode register enable setting of the mode register 126 and the metadata access control circuit 142 may be employed to control access to the metadata. The mode register 126 may provide the MDEN signal having a value based on the metadata feature mode register setting to the metadata access control circuit 142, and the metadata access control circuit 142 may prevent the metadata from being overwritten and/or prevent unauthorized access of the metadata when the MEDN signal indicates that the metadata feature is enabled. In some examples, the mode register setting may default to a value that causes the metadata access control circuit 142 to block access to columns set aside for metadata storage, and is only disabled via an affirmative mode register setting change. In some examples, the mode register setting to block metadata access may be supported by a designated fuse (e.g., access is blocked unless a designated fuse us blown).

In some examples, when the MDEN signal indicates the mode register feature is enabled, the mode register setting the metadata access circuitry 142 may detect a match between a column address and a designated metadata column address, and prevent the column from firing when the match is detected. If no match is detected, the metadata access circuitry 142 may determine a metadata address storage location for metadata associated with the underlying read or write data. Accordingly, when write data and corresponding metadata is received, the metadata access circuitry 142 may be configured to map a metadata column plane to the column address associated with the write data. In a similar manner, during a read operation, when read data and corresponding metadata is requested, the metadata access circuitry 142 may be configured to map the read column address to a metadata column plane storing the corresponding metadata. In some examples, the semiconductor device 100 may perform a double-cycle access operations to store and retrieve both the underlying data, as well as the corresponding metadata. In some examples, to determine which column plane is used to store the metadata, the metadata address generator 142 may be configured to use a subset of the column address bits to assign a particular column plane for storage of metadata corresponding to the column address. For example, the metadata address generator 142 may decode a subset of least-significant bits of the column address to determine a unique column plane at which the metadata is stored. In some examples, the bits of the column address the internal metadata address generator may use to map to a column plane may be based on a number of bits of metadata and the system architecture (e.g., channel width (e.g., ×4, ×8, ×16, etc.) and data size (e.g., 4 bytes, 8 bytes, 16 bytes, etc.)). In some examples, the metadata address generator 142 may use a subset of the column address bits, along with other fixed or one or more other command address bits (e.g., CA10) to map a column address to a metadata address. Using a subset of the column address bits to map storage of metadata within the array may be more efficient in terms of hardware complexity and time consumption as compared with using the entire column address.

The metadata input/output circuit 172 may be configured to manage metadata received from the DQ terminals for storage at the memory array 145 during a write operation and manage metadata received from the memory array 145 for transmission to the DQ terminals during a read operation. In some examples, the metadata may be received and/or transmitted after the underlying data. The metadata may include fewer bits than the underlying data.

The power supply terminals are supplied with power supply potentials VDD and VSS. The power supply potentials VDD and VSS are supplied to a voltage generator circuit 190. The voltage generator circuit 190 generates various internal potentials VPP, VOD, VARY, VPERI, and the like based on the power supply potentials VDD and VSS supplied to the power supply terminals. The internal potential VPP is mainly used in the row decoder 130, the internal potentials VOD and VARY are mainly used in the sense amplifiers SAMP included in the memory array 145, and the internal potential VPERI is used in many peripheral circuit blocks.

The power supply terminals are also supplied with power supply potentials VDDQ and VSSQ. The power supply potentials VDDQ and VSSQ are supplied to the input/output circuit 170. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 170 so that power supply noise generated by the input/output circuit 170 does not propagate to the other circuit blocks.

Figure 2:
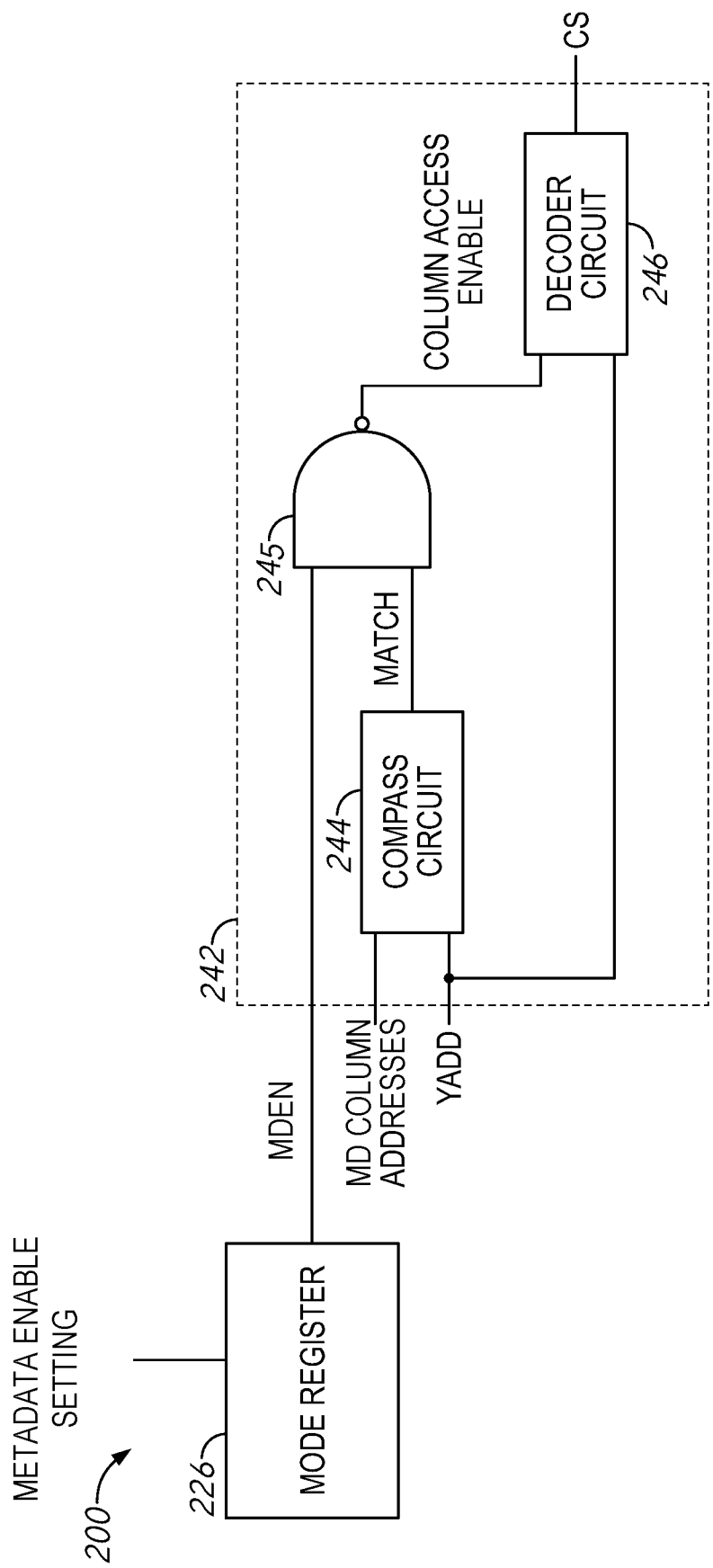
FIG. 2 is a block diagram of a semiconductor device 200 according to some embodiments of the present disclosure.

FIG. 2 is a block diagram of a semiconductor device 200 according to some embodiments of the present disclosure. In some examples, the semiconductor device 200 may include a mode register 226 and a metadata access control circuit 242 configured to support a metadata feature that facilitates handling of metadata corresponding to particular data. The semiconductor device 100 of FIG. 1 may implement the semiconductor device 200 of FIG. 2.

The mode register 226 may be configured to receive a metadata enable setting. The metadata enable setting may be received from an external controller or may be based on a value of a fuse on the semiconductor device semiconductor device 200. Based on the metadata enable setting, the mode register 226 may be configured to provide a metadata enable signal MDEN to the metadata access control circuit 242. If the metadata enable setting has a first value (e.g., indicating that the metadata feature is enabled), the mode register 226 may set the MDEN signal to a first value. If the metadata enable setting has a second value (e.g., indicating that the metadata feature is disabled), the mode register 226 may set the MDEN signal to a second value.

The metadata access control circuit 242 may be configured to provide control access to columns that are set aside for metadata storage. The metadata access control circuit 242 may include a comparator circuit 244, a NAND gate 245, and a decoder circuit 246. The comparator circuit 244 may receive a column address YADD corresponding to an access operation and the column addresses set aside for metadata storage (MD column addresses). The comparator circuit 244 may compare the column address YADD with the MD column addresses, and if a match is detected, the comparator circuit 244 may set the match signal MATCH. The NAND gate 245 may be configured to receive the MATCH signal from the comparator circuit 244 and the MDEN signal from the mode register 226, and to perform a NAND operation on the MATCH signal and the MDEN signal to provide a column access enable signal. That is, if the MDEN signal is set to indicate that the metadata feature is enabled and the MATCH signal is set to indicate a match between the column address YADD and one of the MD column addresses, the NAND gate 245 may clear the column access enable signal to prevent access to the column address YADD. Otherwise, the NAND gate 245 may set the column access enable signal to enable access to the column address YADD (e.g., when the metadata feature is not enabled or when the column address does not match one of the MD column addresses).

The decoder circuit 246 may receive the column access enable signal and the column address YADD. When the column access enable signal is cleared (e.g., indicating that the column address YADD is a metadata column address), the decoder circuit 246 may prevent a column select signal associated with the column address YADD from firing. When the column access enable signal is set (e.g., indicating that access to the column address YADD is permitted), the decoder circuit 246 may decode the column address YADD to fire a corresponding column select signal.

In operation, the semiconductor device 200 may be configured to support a metadata feature that facilitates handling of metadata corresponding to particular data. Typically, to manage data storage, a memory array may be divided into a number of column planes each having a common number of columns. When the underlying data is stored at the memory array, it is split up such that a respective subset of the data is stored at a respective column of each column plane. During an access operation, only one column in a column plane can be accessed contemporaneously, so splitting up the data across multiple column planes allows all of the underlying data to be stored in parallel. The same column address is used to identify the column within each column plane at which the data will be or is stored. For example, during a write operation, a particular column address may designate that column X is to be activated in each column plane to store write data.

However, to preserve space for metadata, the semiconductor device 200 may internally set aside a subset of columns within each column plane may be set aside to store the metadata. Because metadata (e.g., 8 or 16 bits) is a smaller data set than the underlying data (e.g., 64, 128, etc., bits), not all column planes are needed to store metadata for a particular data set. For example, the memory array may include 16 column planes, each having 64 columns. Each column within a particular column plane may be capable of storing eight bits of data during one access operation. So, if column X is activated in each of 16 column planes, a total of 128 bits could be read or written in parallel. However, because corresponding metadata is a smaller number of bits (e.g., 8 or 16 bits), not all column planes would be necessary to store the metadata.

Because the metadata columns are determined internally, the controller communicating with the semiconductor device 200 may be unaware of which columns are configured to metadata storage. Thus, the mode register 226 and the metadata access control circuit 242 may be configured to manage metadata storage, including preventing the metadata form being overwritten or otherwise accessed when the metadata feature is enabled. The metadata feature may be enabled via a mode register setting stored at the mode register 226 based on the metadata enable setting. The mode register 226 may be configured to provide the MDEN signal to indicate whether the metadata feature is enabled. In some examples, the metadata enable setting of the mode register 226 that enables the metadata feature may default to an enabled state. When a controller issues an access command, the corresponding address provided by the controller may intentionally or unwittingly include corresponding to columns of the memory array that are set aside for metadata storage.

In order to protect the metadata from being accessed accidentally or intentionally by the controller, the metadata access control circuit 242 may be employed to control access to the metadata based on the column address YADD and the MDEN signal. In some examples, the mode register setting may default to a value that causes the metadata access control circuit 242 to block access to columns set aside for metadata storage, and is only disabled via an affirmative mode register setting change. In some examples, the mode register setting to block metadata access may be supported by a designated fuse (e.g., access is blocked unless a designated fuse us blown).

In some examples, when the MDEN signal indicates the mode register feature is enabled, the metadata access control circuit 242 may detect a match between the column address YADD and the metadata column addresses, and prevent the column select signal from firing when the match is detected. If no match is detected, the metadata access control circuit 242 may determine a metadata address storage location for metadata associated with the underlying read or write data.

To detect a match, the comparator circuit 244 may compare the column address YADD corresponding to an access operation to the MD column addresses. If a match is detected, the comparator circuit 244 may set the match signal MATCH. The NAND gate 245 may be configured to receive the MATCH signal from the comparator circuit 244 and the MDEN signal from the mode register 226, and to perform a NAND operation on the MATCH signal and the MDEN signal to provide a column access enable signal. That is, if the MDEN signal is set to indicate that the metadata feature is enabled and the MATCH signal is set to indicate a match between the column address YADD and one of the MD column addresses, the NAND gate 245 may clear the column access enable signal to prevent access to the column address YADD. Otherwise, the NAND gate 245 may set the column access enable signal to enable access to the column address YADD (e.g., when the metadata feature is not enabled or when the column address does not match one of the MD column addresses).

The decoder circuit 246 may receive the column access enable signal and the column address YADD. When the column access enable signal is cleared (e.g., indicating that the column address YADD is a metadata column address), the decoder circuit 246 may prevent a column select signal associated with the column address YADD from firing. When the column access enable signal is set (e.g., indicating that access to the column address YADD is permitted), the decoder circuit 246 may decode the column address YADD to fire a corresponding column select signal.

Figure 3:
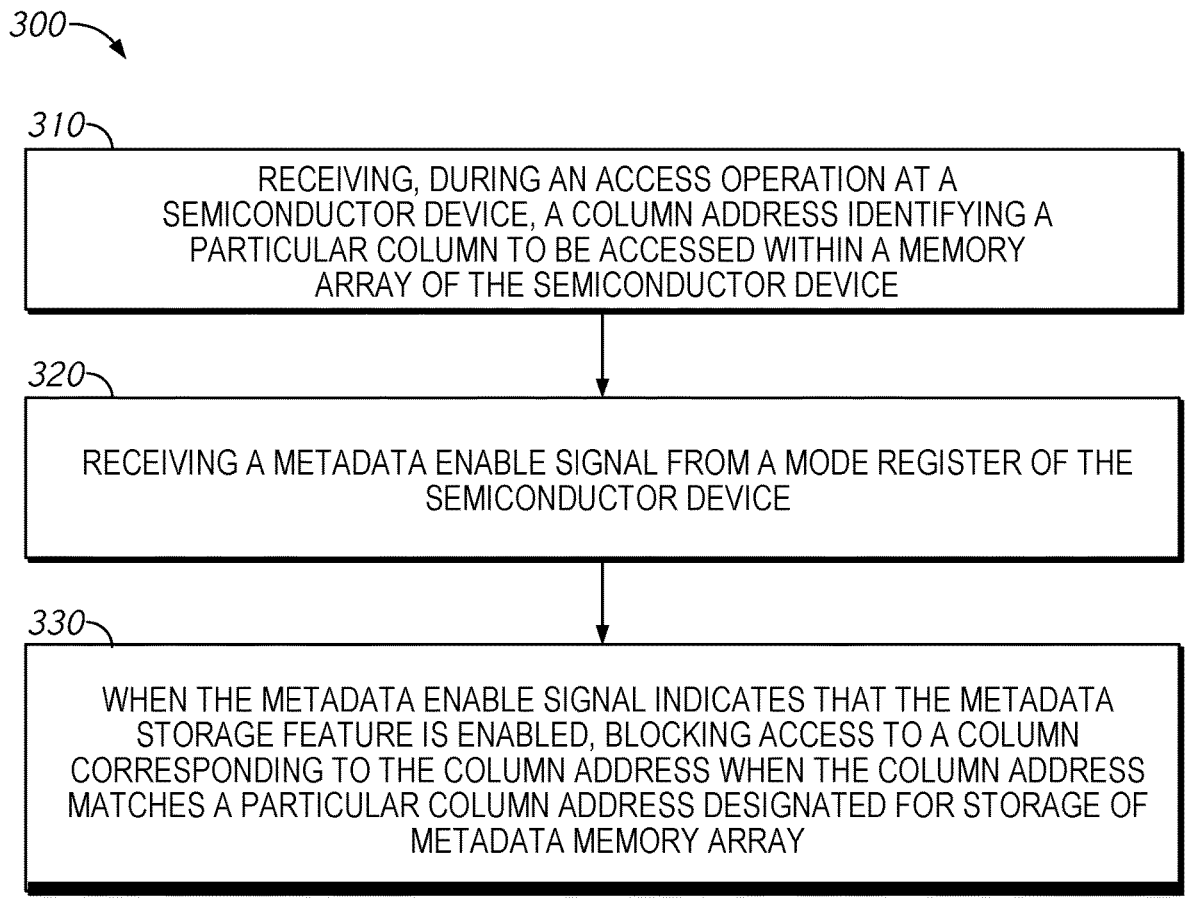
FIG. 3 is a flow chart of a method to control access to columns of a memory array designated for metadata storage according to some embodiments of the present disclosure.

FIG. 3 is a flow chart of a method 300 to control access to columns of a memory array designated for metadata storage according to some embodiments of the present disclosure. The method 300 may, in some embodiments, be implemented by the semiconductor device 100 of FIG. 1 and/or the semiconductor device semiconductor device 200 of FIG. 2.

The method 300 includes receiving, during an access operation at a semiconductor device, a column address identifying a particular column to be accessed within a memory array of the semiconductor device, at 310. The column address may be received at a metadata access control circuit, such as the metadata access control circuit 142 of FIG. 1 or the metadata access control circuit 242 of FIG. 2. The method 300 further includes receiving a metadata enable signal from a mode register of the semiconductor device, at 320. The mode register may include the mode register 126 of FIG. 1 or the mode register 226 of FIG. 2. In some examples, the method 300 includes setting the metadata enable signal based on a command received from a controller. In some examples, the method 300 includes setting the metadata enable signal based on a metadata fuse setting. In some examples, the method 300 includes blowing the fuse configured to disable the metadata.

The method 300 further comprising when the metadata enable signal indicates that the metadata storage feature is enabled, blocking access to a column corresponding to the column address when the column address matches a particular column address designated for storage of metadata memory array, at 330. In some examples, the method 300 includes comparing the column address to the particular column address via a comparator circuit to detect whether the column address matches a particular column address. The comparator circuit may include the comparator circuit 244 of FIG. 2, in some examples. In some examples, the method 300 includes determining a plurality of column addresses designated for storage of metadata, including the particular column address.

In some examples, the method 300 includes, when the metadata enable signal indicates that the metadata storage feature is enabled, preventing activation of a column select signal corresponding to the column associated with the column address when the column address matches a particular column address designated for storage of metadata. In some examples, the method 300 may further include permitting access to the column corresponding to the column address when the metadata enable signal indicates that the metadata storage feature is disabled or when the column associated with the column address when the column address is different than every column address designated for storage of metadata Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
a memory array;
a mode register configured to provide a metadata enable signal indicating whether a metadata storage feature is enabled; and
a column decoder, configured to, during an access operation, receive a column address identifying a particular column to be accessed within the memory array and the metadata enable signal; wherein, when the metadata enable signal indicates that the metadata storage feature is enabled, the column decoder is configured to block access to a column corresponding to the column address when the column address matches a particular column address designated for storage of metadata and wherein the column decoder comprises a metadata access control circuit configured to determine whether access to the column address should be blocked based on the column address and the metadata enable signal.

2. The apparatus of claim 1, wherein the column decoder is configured to determine a plurality of column addresses designated for storage of metadata, including the particular column address.

3. The apparatus of claim 1, wherein the metadata access control circuit comprises a comparator configured to compare the column address to the particular column address to detect whether the column address matches a particular column address.

4. The apparatus of claim 3, wherein the metadata access control circuit comprises a NAND logic gate configured to apply NAND logic to the output of the comparator and the metadata enable signal to block access to the column address.

5. The apparatus of claim 1, wherein the mode register is configured to set the metadata enable signal based on a command received from a controller.

6. An apparatus comprising:
a memory array;
a mode register configured to provide a metadata enable signal indicating whether a metadata storage feature is enabled; and
a column decoder, configured to, during an access operation, receive a column address identifying a particular column to be accessed within the memory array and the metadata enable signal; wherein, when the metadata enable signal indicates that the metadata storage feature is enabled, the column decoder is configured to block access to a column corresponding to the column address when the column address matches a particular column address designated for storage of metadata and wherein the mode register is configured to set the metadata enable signal based on a metadata fuse setting.

7. The apparatus of claim 6, further comprising the fuse configured to indicate whether the metadata feature is enabled.

8. An apparatus comprising:
a memory array;
a mode register configured to provide a metadata enable signal indicating whether a metadata storage feature is enabled; and
a column decoder, configured to, during an access operation, receive a column address identifying a particular column to be accessed within the memory array and the metadata enable signal; wherein, when the metadata enable signal indicates that the metadata storage feature is enabled, the column decoder is configured to block access to a column corresponding to the column address when the column address matches a particular column address designated for storage of metadata and wherein the column decoder is configured to, when the metadata enable signal indicates that the metadata storage feature is enabled, prevent activation of a column select signal corresponding to the column associated with the column address when the column address matches a particular column address designated for storage of metadata.

9. An apparatus comprising:
a memory array;
a mode register configured to provide a metadata enable signal indicating whether a metadata storage feature is enabled; and
a column decoder, configured to, during an access operation, receive a column address identifying a particular column to be accessed within the memory array and the metadata enable signal; wherein, when the metadata enable signal indicates that the metadata storage feature is enabled, the column decoder is configured to block access to a column corresponding to the column address when the column address matches a particular column address designated for storage of metadata and wherein the column decoder is configured to allow access to the column corresponding to the column address when the metadata enable signal indicates that the metadata storage feature is disabled or when the column associated with the column address when the column address is different than every column address designated for storage of metadata.

10. An apparatus comprising:
a mode register configured to receive a metadata enable setting and to provide a metadata enable signal based on the metadata enable setting; and
a metadata access control circuit configured to receive the metadata enable setting and a column address identifying a particular column to be accessed within a memory array, wherein the metadata access control circuit is configured to block access to a column corresponding to the column address when the column address matches one of a plurality of particular column addresses designated for storage of metadata and the metadata enable signal has a first value, wherein the metadata access control circuit is configured to permit access to a column corresponding to the column address when the column address is different than every one of the a plurality of particular column addresses designated for storage of metadata or the metadata enable signal has a second value.

11. The apparatus of claim 10, further comprising a column decoder configured to determine the plurality of particular column addresses designated for storage of metadata.

12. The apparatus of claim 10, wherein the metadata access control circuit comprises a comparator configured to compare the column address to each of the plurality of particular column addresses designated for storage of metadata to detect a match.

13. The apparatus of claim 10, wherein the mode register is configured to receive the metadata enable setting from a controller.

14. The apparatus of claim 10, wherein the mode register is configured to receive the metadata enable setting from a metadata enable fuse setting.

15. A method comprising:
receiving, during an access operation at a semiconductor device, a column address identifying a particular column to be accessed within a memory array of the semiconductor device;
receiving a metadata enable signal from a mode register of the semiconductor device;
when the metadata enable signal indicates that the metadata storage feature is enabled, blocking access to a column corresponding to the column address when the column address matches a particular column address designated for storage of metadata memory array; and
comparing the column address to the particular column address via a comparator circuit to detect whether the column address matches the particular column address.

16. The method of claim 15, further comprising determining a plurality of column addresses designated for storage of metadata, including the particular column address.

17. The method of claim 15, further comprising setting the metadata enable signal based on a command received from a controller.

18. A method comprising:
receiving, during an access operation at a semiconductor device, a column address identifying a particular column to be accessed within a memory array of the semiconductor device;
setting a metadata enable signal based on a metadata fuse setting;
receiving the metadata enable signal from a mode register of the semiconductor device; and when the metadata enable signal indicates that the metadata storage feature is enabled, blocking access to a column corresponding to the column address when the column address matches a particular column address designated for storage of metadata memory array.

19. The method of claim 18, further comprising blowing the fuse configured to disable the metadata feature.

20. A method comprising:
receiving, during an access operation at a semiconductor device, a column address identifying a particular column to be accessed within a memory array of the semiconductor device;
receiving a metadata enable signal from a mode register of the semiconductor device; and
when the metadata enable signal indicates that the metadata storage feature is enabled, blocking access to a column corresponding to the column address when the column address matches a particular column address designated for storage of metadata memory array and preventing activation of a column select signal corresponding to the column associated with the column address when the column address matches a particular column address designated for storage of metadata.

21. A method comprising:
receiving, during an access operation at a semiconductor device, a column address identifying a particular column to be accessed within a memory array of the semiconductor device;
receiving a metadata enable signal from a mode register of the semiconductor device;
when the metadata enable signal indicates that the metadata storage feature is enabled, blocking access to a column corresponding to the column address when the column address matches a particular column address designated for storage of metadata memory array; and
permitting access to the column corresponding to the column address when the metadata enable signal indicates that the metadata storage feature is disabled or when the column associated with the column address when the column address is different than every column address designated for storage of metadata.

* * * * *